(12) United States Patent
Ozaki

(10) Patent No.: US 7,650,776 B2
(45) Date of Patent: Jan. 26, 2010

(54) SUBSTRATE PROCESSING APPARATUS

(75) Inventor: Hidehiko Ozaki, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 474 days.

(21) Appl. No.: 11/693,330

(22) Filed: Mar. 29, 2007

(65) Prior Publication Data
US 2007/0231928 A1    Oct. 4, 2007

(30) Foreign Application Priority Data

| Mar. 30, 2006 | (JP) | ............................. 2006-093469 |
| Mar. 30, 2006 | (JP) | ............................. 2006-093470 |
| Jan. 12, 2007 | (JP) | ............................. 2007-004277 |

(51) Int. Cl.
*G01N 7/00* (2006.01)

(52) U.S. Cl. ....................................... 73/23.2

(58) Field of Classification Search .................. 73/23.2
See application file for complete search history.

(56) References Cited

U.S. PATENT DOCUMENTS

2006/0005422 A1    1/2006    Yi

FOREIGN PATENT DOCUMENTS

| JP | 09-190997 | 7/1997 |
| JP | 2006-24931 | 1/2006 |

*Primary Examiner*—Hezron Williams
*Assistant Examiner*—Rodney T Frank
(74) *Attorney, Agent, or Firm*—Ostrolenk Faber LLP

(57) ABSTRACT

A substrate processing apparatus of the present invention dilutes a sample gas by mixing the sample gas with nitrogen gas and measures the concentration of IPA gas contained in the diluted sample gas in a concentration measuring part. Then, the substrate processing apparatus calculates the concentration ($C0$) of IPA gas contained in the sample gas before being diluted by multiplying the measured concentration value ($C1$) by the reciprocal ($1/P$) of a dilution rate which is obtained on the basis of the amount of flow of the sample gas and that of the diluent gas, as $C0=C1\times(1/P)$. Therefore, even if IPA gas of high concentration is used, it is possible to accurately measure the concentration of the IPA gas.

20 Claims, 6 Drawing Sheets

SUBSTRATE PROCESSING APPARATUS

BACKGROUND OF THE INVENTION

1. Field of the Invention

The present invention relates to a substrate processing apparatus for performing various processings, such as drying, on substrates, such as semiconductor wafers, glass substrates for liquid crystal displays and glass substrates for PDPs, with a process gas which is supplied into a processing chamber together with a carrier gas.

2. Description of the Background Art

In a process of manufacturing substrates, conventionally, a substrate processing apparatus for processing substrates by supplying a process gas to the surrounding of the substrates is well known. For example, well known is a substrate processing apparatus for drying substrates by supplying IPA (isopropyl alcohol) gas to the surrounding of the substrates after being cleaned. A process gas such as IPA gas is supplied into a processing chamber by using an inert gas such as nitrogen gas as a carrier gas.

In such a substrate processing apparatus, the processing effect of drying process or the like on the substrates largely varies depending on the concentration of the process gas. For this reason, it is necessary to accurately measure the concentration of a process gas contained in gas supplied to the surrounding of the substrates. In the background-art substrate processing apparatus, the concentration of a process gas is measured by a concentration meter provided in the processing chamber or by extracting part of the gas supplied to the surrounding of the substrates.

In drying of substrates with IPA gas, it is desirable to allow the drying process on the substrates to rapidly proceed in order to prevent a drying failure such as a water mark occurring on surfaces of the substrates. Therefore, in substrate processing apparatuses of recent years, IPA gas of very high concentration is supplied into a processing chamber in some cases. In such a case where a process gas of high concentration is used, disadvantageously, there are some cases where the concentration of the process gas can not be accurately measured as the concentration of the process gas exceeds the measurement limit of a concentration meter.

SUMMARY OF THE INVENTION

The present invention is intended for a substrate processing apparatus for processing a substrate with a process gas. According to the present invention, the substrate processing apparatus comprises a dilution part for diluting a sample gas by mixing the sample gas extracted by an extraction part with a diluent gas supplied by a diluent gas supply part, a concentration meter for measuring the concentration of a process gas contained in the sample gas diluted by the dilution part, a first flowmeter for measuring the amount of flow of the sample gas before being diluted, which flows in a pipe from the extraction part to the dilution part or the amount of flow of the sample gas after being diluted, which flows in a pipe from the dilution part, a second flowmeter for measuring the amount of flow of the diluent gas flowing in a pipe from the diluent gas supply part to the dilution part, and a calculation part for calculating the concentration of the process gas contained in the sample gas before being diluted, on the basis of respective measured values of the concentration meter, the first flowmeter and the second flowmeter.

The concentration of the sample gas after being diluted is measured and then the concentration of the process gas before being diluted can be measured on the basis of the measured value and the amount of flow of the sample gas and that of the diluent gas. Therefore, even if a process gas of high concentration is used, it is possible to accurately measure the concentration of the process gas.

Preferably, the calculation part calculates the concentration of the process gas contained in the sample gas before being diluted, by multiplying the measured value of the concentration meter by the reciprocal of a dilution rate which is obtained on the basis of the respective measured values of the first flowmeter and the second flowmeter.

It is thereby possible to easily and accurately calculate the concentration of the process gas contained in the sample gas before being diluted.

Preferably, the substrate processing apparatus further comprises a flow rate control part for sample gas before dilution, which controls the flow rate of the sample gas flowing in a pipe from the extraction part to the dilution part.

The measured value of the first flowmeter is thereby stabilized and it is therefore possible to more accurately calculate the concentration of the process gas.

Preferably, the substrate processing apparatus further comprises a flow rate control part for sample gas after dilution, which controls the flow rate of the sample gas flowing in a pipe from the dilution part to the concentration meter.

The measured value of the first flowmeter is thereby stabilized and it is therefore possible to more accurately calculate the concentration of the process gas.

Preferably, the substrate processing apparatus further comprises a flow rate control part for diluent gas, which controls the flow rate of the diluent gas flowing in a pipe from the diluent gas supply part to the dilution part.

The measured value of the second flowmeter is thereby stabilized and it is therefore possible to more accurately calculate the concentration of the process gas.

Preferably, the substrate processing apparatus further comprises a temperature control part for sample gas, which controls the temperature of the sample gas flowing in a pipe from the extraction part to the dilution part.

A decrease in temperature of the sample gas in a supply path is thereby prevented and a condensation of the process gas contained in the sample gas is suppressed. It is therefore possible to more accurately calculate the concentration of the process gas.

Preferably, the substrate processing apparatus further comprises a temperature control part for diluent gas, which controls the temperature of the diluent gas flowing in a pipe from the diluent gas supply part to the dilution part.

A decrease in temperature of the sample gas during dilution is thereby prevented and a condensation of the process gas contained in the sample gas is suppressed. It is therefore possible to more accurately calculate the concentration of the process gas.

Preferably, the substrate processing apparatus further comprises a container for accommodating a gas pipe line including the concentration meter, the first flowmeter and the second flowmeter, and a jet part for jetting the diluent gas of which temperature is controlled by the temperature control part for diluent gas into the container.

A decrease in temperature of the sample gas in the entire gas pipe line contained in the container is thereby prevented and a condensation of the process gas contained in the sample gas is suppressed. It is therefore possible to more accurately calculate the concentration of the process gas.

Preferably, the diluent gas supply part supplies a carrier gas as a diluent gas.

It is thereby possible to accurately dilute the sample gas without increasing the kinds of gas contained in the sample gas. Further, since the carrier gas and the diluent gas can be supplied from the same gas source, it is possible to simplify the construction of the substrate processing apparatus.

Preferably, the extraction part is capable of switching between a first state where part of gas inside the processing chamber is extracted as a sample gas and a second state where part of gas supplied by the process gas supply part is extracted as a sample gas.

The substrate processing apparatus can respond to both the case of measuring the concentration of the process gas contained in the gas inside the processing chamber and the case of measuring the concentration of the process gas contained in the gas supplied from the process gas supply part.

Preferably, the extraction part extracts a sample gas through a gas extraction port which is provided separately from the process gas supply part.

It is thereby possible to extract the gas inside the processing chamber while supplying the process gas from the process gas supply part.

Therefore, it is an object of the present invention to provide a substrate processing apparatus which is capable of measuring the concentration of process gas with accuracy even if a process gas of high concentration is used.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereafter, a preferred embodiment of the present invention will be discussed, with reference to the drawings.

<1. Construction of Substrate Processing Apparatus and Substrate Processing Operation>

Figure 1:
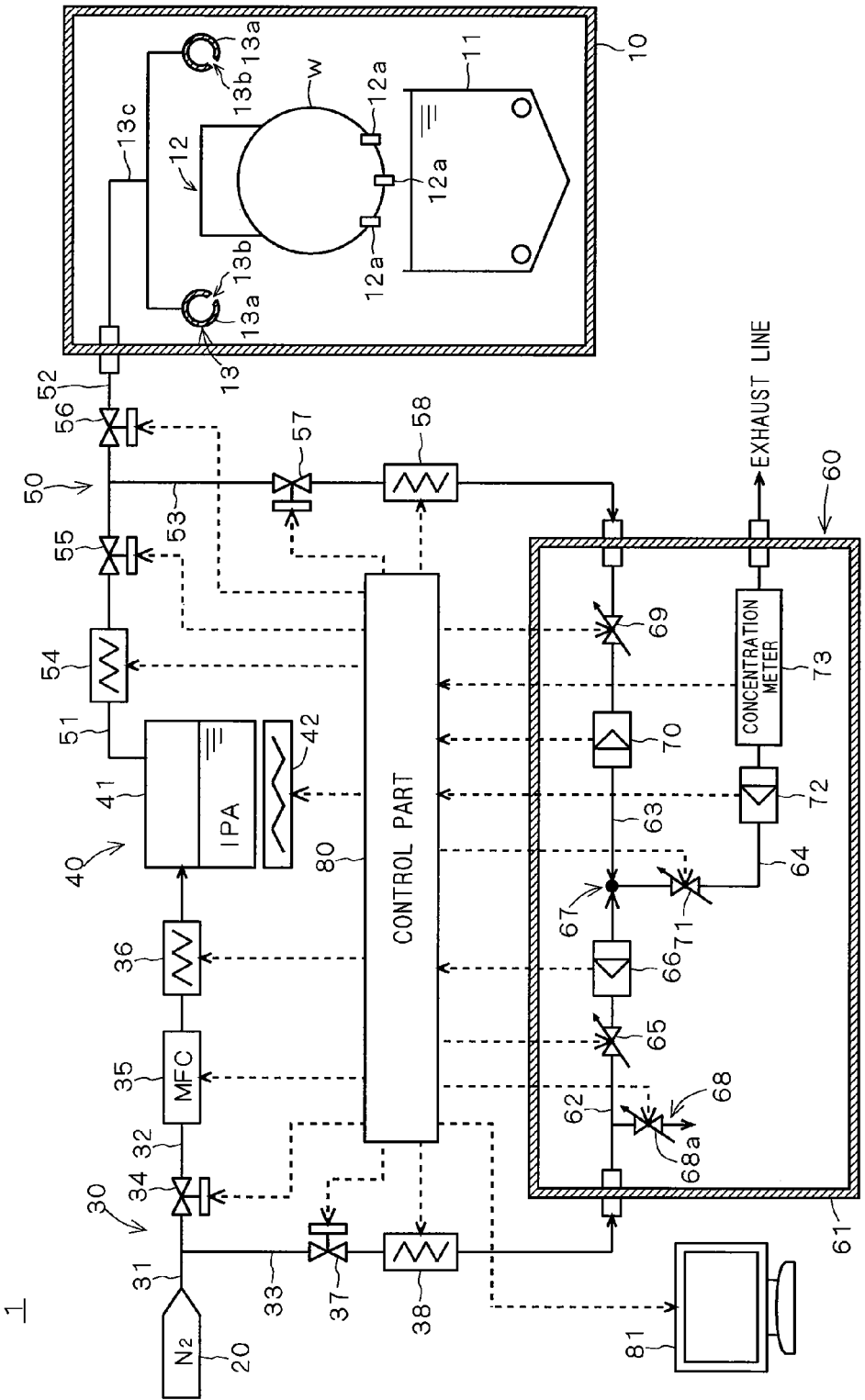
FIG. 1 is a block diagram showing a construction of a substrate processing apparatus in accordance with one preferred embodiment of the present invention.

FIG. 1 is a block diagram showing a construction of a substrate processing apparatus 1 in accordance with one preferred embodiment of the present invention. The substrate processing apparatus 1 is an apparatus for performing cleaning of a plurality of substrates W by collectively immersing the substrates W in pure water and then performing drying of the substrates W by supplying IPA gas to the surrounding of the substrates W which are drawn out of the pure water. As shown in FIG. 1, the substrate processing apparatus 1 mainly comprises a processing chamber 10, a nitrogen gas source 20, a first piping part 30, an IPA gas generation part 40, a second piping part 50, a concentration measuring part 60 and a control part 80.

The processing chamber 10 is a case having a processing space therein, for performing cleaning and drying of substrates W. Inside the processing chamber 10 provided are a processing bath 11, a lifter 12 and an IPA gas discharge part 13. The processing bath 11 is a container for pooling pure water used for cleaning the substrates W. To the processing bath 11 connected are a pure water supply part and a drainage part both of which are not shown. When the substrates W are immersed in the pure water pooled in the processing bath 11, contaminants such as particles deposited on surfaces of the substrates W are removed from the surfaces of the substrates W by the pure water.

The lifter 12 is a transfer mechanism for vertically transferring the substrates W inside the processing chamber 10. The lifter 12 comprises three holding rods 12a arranged horizontally, and the substrates W stand, being held by a plurality of holding grooves provided on each of the holding rods 12a. The lifter 12 further comprises a driving part (not shown) having a servomotor, a timing belt and the like. When the driving part is operated, the lifter 12 holding the substrates W vertically moves and the substrates W are transferred between an immersion position inside the processing bath 11 and a drawing-up position over the processing bath 11.

The IPA gas discharge part 13 comprises two discharge tubes 13a. The two discharge tubes 13a are arranged along the row of the substrates W at respective positions over the processing bath 11 and each provided with a plurality of discharge ports 13b. To the discharge tubes 13a connected is a pipe 13c communicating with a pipe 52 in a second piping part 50 described later. The IPA gas supplied from the second piping part 50 is thereby introduced to the discharge tubes 13a through the pipe 13c and discharged from the discharge ports 13b into the processing chamber 10. In measuring of the concentration of the IPA gas contained in gas inside the processing chamber 10, part of the gas inside the processing chamber 10 is taken into the discharge tubes 13a through the discharge ports 13b and the gas which is taken in is led out through the pipe 13c to the pipe 52 in the second piping part 50. In other words, the IPA gas discharge part 13 serves to extract part of the gas inside the processing chamber 10 as a sample gas.

A first piping part 30 has a plurality of pipes 31 to 33 and sends nitrogen gas supplied from the nitrogen gas source 20 to the IPA gas generation part 40 and the concentration measuring part 60. The pipe 31 has an upstream-side end which is connected to the nitrogen gas source 20 and a downstream-side end which branches out into the pipes 32 and 33. On the way of the pipe 32, an on-off valve 34, a massflow controller 35 and a heater 36 are inserted from the upstream side, and the downstream side of the pipe 32 is connected to the IPA gas generation part 40. Therefore, when the on-off valve 34 is opened, nitrogen gas is supplied from the nitrogen gas source 20 to the IPA gas generation part 40 through the pipes 31 and 32. The massflow controller 35 serves to control the flow rate of the nitrogen gas flowing in the pipe 32. When the heater 36 is operated, the nitrogen gas flowing in the pipe 32 is heated. On the other hand, on the way of the pipe 33, an on-off valve 37 and a heater 38 are inserted from the upstream side, and the downstream side of the pipe 33 is connected to the concentration measuring part 60. Therefore, when the on-off valve 37 is opened, nitrogen gas is supplied from the nitrogen gas source 20 to the concentration measuring part 60 through the pipes 31 and 33. When the heater 38 is operated, the nitrogen gas flowing in the pipe 33 is heated.

The IPA gas generation part 40 comprises a tank 41 for pooling a liquid of IPA and a heater 42 provided onto a bottom of the tank 41. When the heater 42 is operated, the liquid of IPA pooled in the tank 41 is heated and the liquid of IPA is vaporized to generate IPA gas. The IPA gas generated in the tank 41 uses the nitrogen gas supplied through the pipes 31 and 32 in the first piping part 30 as a carrier gas and is sent to the second piping part 50 together with the nitrogen gas.

The second piping part 50 has a plurality of pipes 51 to 53 and serves as a supply path for the IPA gas from the IPA gas generation part 40 to the processing chamber 10 and also serves as a supply path for the sample gas from the IPA gas generation part 40 or the processing chamber 10 to the concentration measuring part 60. The pipe 51 has an upstream-side end which is connected to the IPA gas generation part 40 and on the way of the pipe 51, a heater 54 and an on-off valve 55 are inserted from the upstream side. The downstream-side end of the pipe 51 branches out into the pipes 52 and 53. On the way of the pipe 52, an on-off valve 56 is inserted, and the downstream side of the pipe 52 is connected to the pipe 13c in the processing chamber 10. Therefore, when the on-off valves 55 and 56 are opened, the IPA gas is sent, together with the nitrogen gas, from the IPA gas generation part 40 into the processing chamber 10 through the pipes 51 and 52. When the heater 54 is operated, the nitrogen gas and the IPA gas which flow in the pipe 51 are heated. On the other hand, on the way of the pipe 53, an on-off valve 57 and a heater 58 are inserted from the upstream side, and the downstream side of the pipe 53 is connected to the concentration measuring part 60. Therefore, when the on-off valves 55 and 57 are opened, part of the gas supplied from the IPA gas generation part 40 is sent to the concentration measuring part 60 through the pipes 51 and 53 as a sample gas. Further, when the on-off valve 55 is closed and the on-off valves 56 and 57 are opened, the gas inside the processing chamber 10 which is extracted from the IPA gas discharge part 13 is sent to the concentration measuring part 60 through the pipes 52 and 53. When the heater 58 is operated, the sample gas flowing in the pipe 53 is heated.

The concentration measuring part 60 is a measuring part for diluting the sample gas supplied through the pipe 53 and measuring the concentration of a process gas contained in the diluted sample gas. The concentration measuring part 60 has a container 61 and pipes 62 to 64 arranged inside the container 61. The pipe 62 has an upstream-side end which is connected to the pipe 33 in the first piping part 30, and on the way of the pipe 62, a variable flow rate control valve 65 and a flowmeter 66 are inserted from the upstream side. The downstream side of the pipe 62 merges into the pipe 63 at a confluence 67. Therefore, the nitrogen gas supplied as a diluent gas through the pipes 31 and 33 in the first piping part 30 is introduced to the confluence 67 through the pipe 62. The variable flow rate control valve 65 serves to control the flow rate of the nitrogen gas flowing in the pipe 62 and the flowmeter 66 serves to measure the amount of flow of the nitrogen gas flowing in the pipe 62. An upstream position of the variable flow rate control valve 65 on the way of the pipe 62 provided is a jet part 68 to jet part of the nitrogen gas in the pipe 62. Therefore, the part of the nitrogen gas heated by the heater 38 is jetted from the jet part 68 into an interior space of the container 61, to thereby prevent a decrease in temperature of the entire inside of the container 61. The jet part 68 is provided with a variable flow rate control valve 68a for controlling the jet rate of nitrogen gas.

On the other hand, the pipe 63 has an upstream-side end which is connected to the pipe 53 in the second piping part 50, and on the way of the pipe 63, a variable flow rate control valve 69 and a flowmeter 70 are inserted from the upstream side. The downstream side of the pipe 63 merges into the pipe 62 at the confluence 67. Therefore, the sample gas supplied through the pipe 53 in the second piping part 50 is introduced to the confluence 67 through the pipe 63. At the confluence 67, the sample gas introduced through the pipe 63 and the nitrogen gas introduced through the pipe 62 are mixed, and the sample gas is thereby diluted. The variable flow rate control valve 69 serves to control the flow rate of the sample gas flowing in the pipe 63 and the flowmeter 70 serves to measure the amount of flow of the sample gas flowing in the pipe 63.

The pipe 64 has an upstream-side end which is connected to the confluence 67, and on the way of the pipe 64, a variable flow rate control valve 71, a flowmeter 72 and a concentration meter 73 are inserted from the upstream side. The downstream-side end of the pipe 64 is connected to an exhaust line outside the container 61. Therefore, the sample gas diluted at the confluence 67 is discharged to the exhaust line through the pipe 64. The variable flow rate control valve 71 serves to control the flow rate of the sample gas flowing in the pipe 64 and the flowmeter 72 serves to measure the amount of flow of the sample gas flowing in the pipe 64. The concentration meter 73 serves to measure the concentration of the IPA gas contained in the sample gas flowing in the pipe 64.

The control part 80 is electrically connected to the above-described flowmeters 66, 70 and 72 and the concentration meter 73 and acquires respective measured values of these meters. The control part 80 is also electrically connected to the above-described lifter 12, the on-off valves 34, 37, 55, 56 and 57, the massflow controller 35, the heaters 36, 38, 42, 54 and 58 and the variable flow rate control valves 65, 68a, 69 and 71, and controls the operations of these constituents. The control part 80 is formed of a computer which comprises a CPU and memories and performs controls on the above constituents by an operation of the CPU on the basis of a predetermined program. To the control part 80 connected is a display part 81 formed of a liquid crystal display or a CRT. The control part 80 performs a predetermined calculation (Steps S23 to S24, S33 to S34 discussed later) on the basis of the respective measured values acquired from the flowmeters 66, 70 and 72 and the concentration meter 73 and displays the calculated concentration value on the display part 81.

Figure 2:
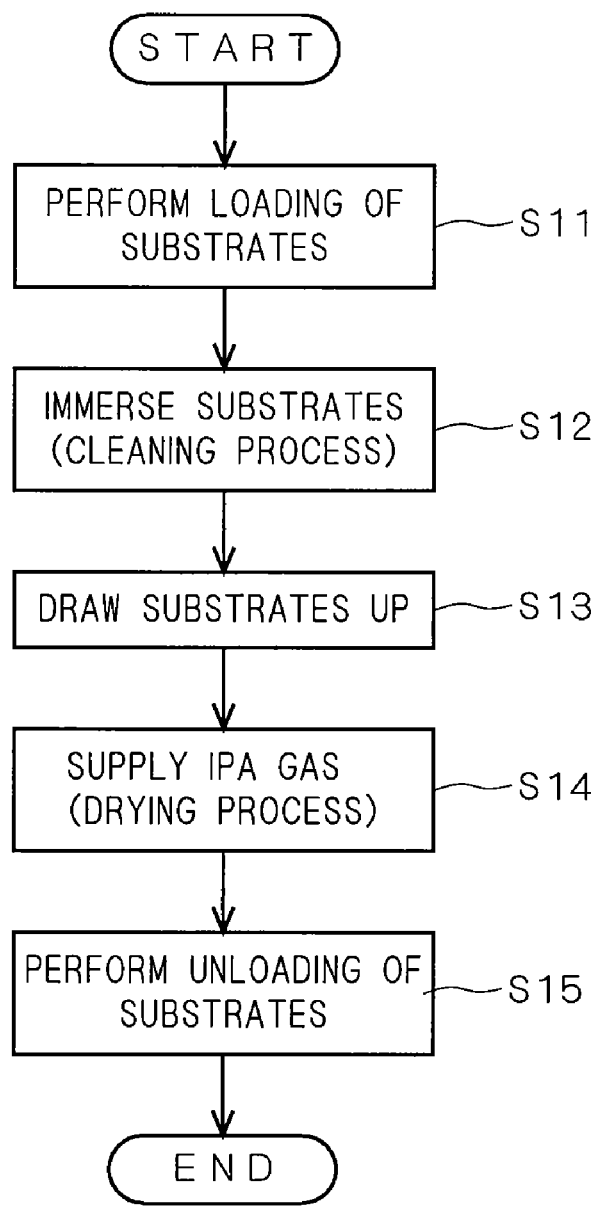
FIG. 2 is a flowchart showing an operation flow for processing of substrates in the substrate processing apparatus.

FIG. 2 is a flowchart showing an operation flow for processing of substrates in the substrate processing apparatus 1. In a processing of the substrates W by the substrate processing apparatus 1, first, the substrates W are loaded into the processing chamber 10 and placed on the lifter 12 which is waiting inside the processing chamber 10 (Step S11). The substrate processing apparatus 1 allows the lifter 12 holding the substrates W to move downwardly to immerse the substrates W into the pure water pooled in the processing bath 11 (Step S12). Contaminants such as particles deposited on surfaces of the substrates W are removed by the pure water and the surfaces of the substrates W are thus cleaned. When the immersion process for a predetermined time period is finished, the substrate processing apparatus 1 allows the lifter 12 to move upwardly to draw the substrates W up from the processing bath 11 (Step S13). The substrate processing apparatus 1 opens the on-off valves 34, 55 and 56 and operates the heater 42 in the IPA gas generation part 40, to thereby supply the IPA gas together with the nitrogen gas into the processing chamber 10 (Step S14). At this time, the substrate processing apparatus 1 operates the heater 36 in the first piping part 30 and the heater 54 in the second piping part 50, to thereby prevent condensation of the IPA gas during being supplied due to temperature decrease. The IPA gas supplied into the processing chamber 10 is jetted from the discharge ports 13b of the discharge tubes 13a toward the substrates W. The IPA gas is condensed on the surfaces of the substrates W to replace the pure water deposited on the surfaces of the substrates W. Then, droplets of IPA are vaporized from the surfaces of the substrates W and the surfaces of the substrates W are dried. When drying of the substrates W is finished, the substrates W are unloaded out of the processing chamber 10 (Step S15), and thus the processing of the substrates W in the substrate processing apparatus 1 is completed.

<2. Measurement of Concentration (Using Gas in Processing Chamber as Sample Gas>

Figure 3:
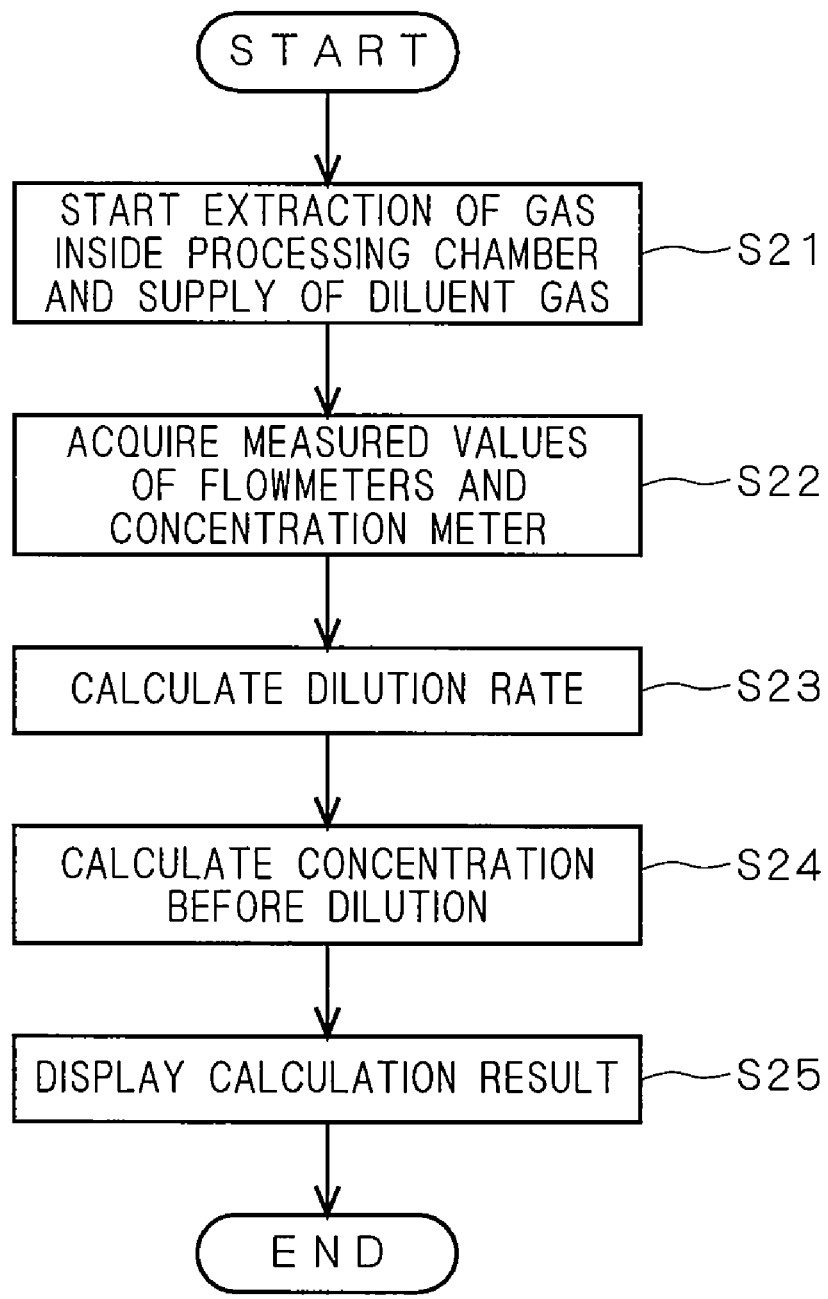
FIG. 3 is a flowchart showing an operation flow for measurement of concentration where gas inside a processing chamber is used as a sample gas.

Next, referring to the flowchart of FIG. 3, discussion will be made on a process of measuring the concentration of IPA gas with the gas inside the processing chamber 10 used as a sample gas. First, the substrate processing apparatus 1 closes the on-off valve 55 and opens the on-off valves 37, 56 and 57. This starts extraction of the gas inside the processing chamber 10 and supply of a diluent gas (Step S21). Part of the gas inside the processing chamber 10 is taken into the discharge tubes 13a as a sample gas and sent to the confluence 67 through the pipes 13c, 52, 53 and 63. The nitrogen gas serving as a diluent gas is sent from the nitrogen gas source 20 to the confluence 67 through the pipes 31, 33 and 62. The sample gas and the nitrogen gas are mixed at the confluence 67, and the sample gas is thereby diluted. Then, the diluted sample gas is discharged to the exhaust line through the pipe 64.

At this time, the substrate processing apparatus 1 operates the heater 58 to heat the sample gas in the pipe 53. This prevents a decrease in temperature of the sample gas and suppresses condensation of the IPA gas contained in the sample gas. Further, the substrate processing apparatus 1 operates the heater 38 to heat the nitrogen gas in the pipe 33. This prevents a decrease in temperature of the sample gas during dilution and suppresses condensation of the IPA gas contained in the sample gas. Part of the nitrogen gas heated by the heater 38 is jetted from the jet part 68 into the container 61. This prevents a decrease in temperature of the sample gas in the entire pipe line included in the container 61 and suppresses condensation of the IPA gas contained in the sample gas.

Next, the substrate processing apparatus 1 acquires the respective measured values of the flowmeters 66, 70 and 72 and the concentration meter 73 (Step S22). The amount of flow of the diluent gas flowing in the pipe 62 is measured by the flowmeter 66 and the measured value is sent to the control part 80. The substrate processing apparatus 1 adjusts the degree of opening of the variable flow rate control valve 65 to control the flow rate of the diluent gas, and thereby stabilizes the measurement result of the flowmeter 66. This increases the accuracy of the following calculation. The amount of flow of the sample gas before being diluted is measured by the flowmeter 70 and the measured value is sent to the control part 80. The substrate processing apparatus 1 adjusts the degree of opening of the variable flow rate control valve 69 to control the flow rate of the sample gas, and thereby stabilizes the measurement result of the flowmeter 70. This increases the accuracy of the following calculation. The amount of flow of the sample gas after being diluted is measured by the flowmeter 72 and the measured value is sent to the control part 80. The substrate processing apparatus 1 adjusts the degree of opening of the variable flow rate control valve 71 to control the flow rate of the sample gas, and thereby stabilizes the measurement result of the flowmeter 72. This increases the accuracy of the following calculation. The concentration of the IPA gas contained in the diluted sample gas is measured by the concentration meter 73 and the measured value is sent to the control part 80.

Figure 4:
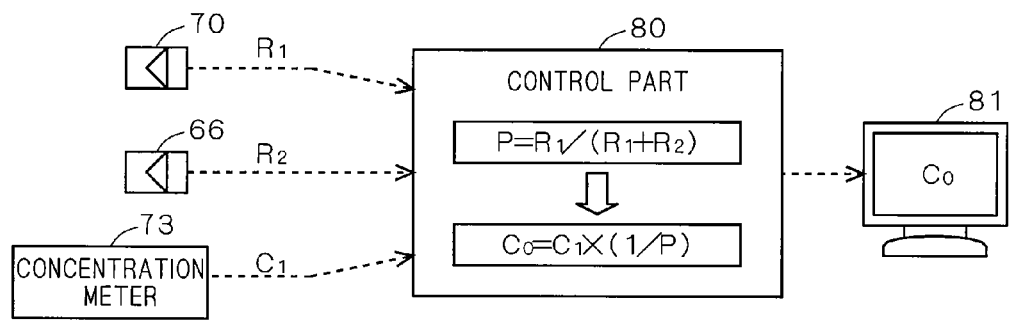
FIGS. 4 and 5 are views each illustrating a calculation performed on the basis of measurement results.
Figure 5:
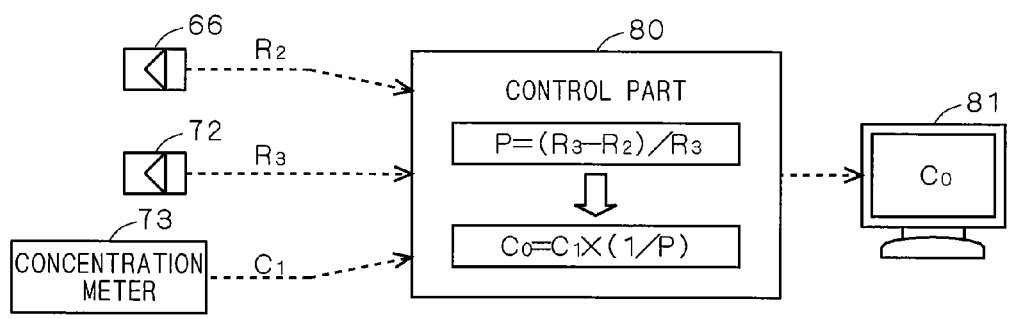

Subsequently, the substrate processing apparatus 1 calculates the dilution rate of the sample gas on the basis of the acquired measurement results (Step S23). The dilution rate can be calculated by using either of two calculations shown in FIGS. 4 and 5 and either one may be used therefor. With the calculation of FIG. 4, the dilution rate (P) of the sample gas is calculated by using the measured value (R1) of the flowmeter 70 and the measured value (R2) of the flowmeter 66, as $P=R1/(R1+R2)$. With the calculation of FIG. 5, the dilution rate (P) of the sample gas is calculated by using the measured value (R2) of the flowmeter 66 and the measured value (R3) of the flowmeter 72, as $P=(R3-R2)/R3$.

After that, the control part 80 multiplies the measured value (C1) of the concentration meter 73 by the reciprocal of the above dilution rate (1/P) to calculate the concentration (C0) of the IPA gas contained in the sample gas before being diluted, as $C0=C1\times(1/P)$ (Step S24). Then, the substrate processing apparatus 1 displays the calculated concentration (C0) of the IPA gas on the display part 81 (Step S25).

<3. Measurement of Concentration (Using Gas Supplied into Processing Chamber as Sample Gas>

Figure 6:
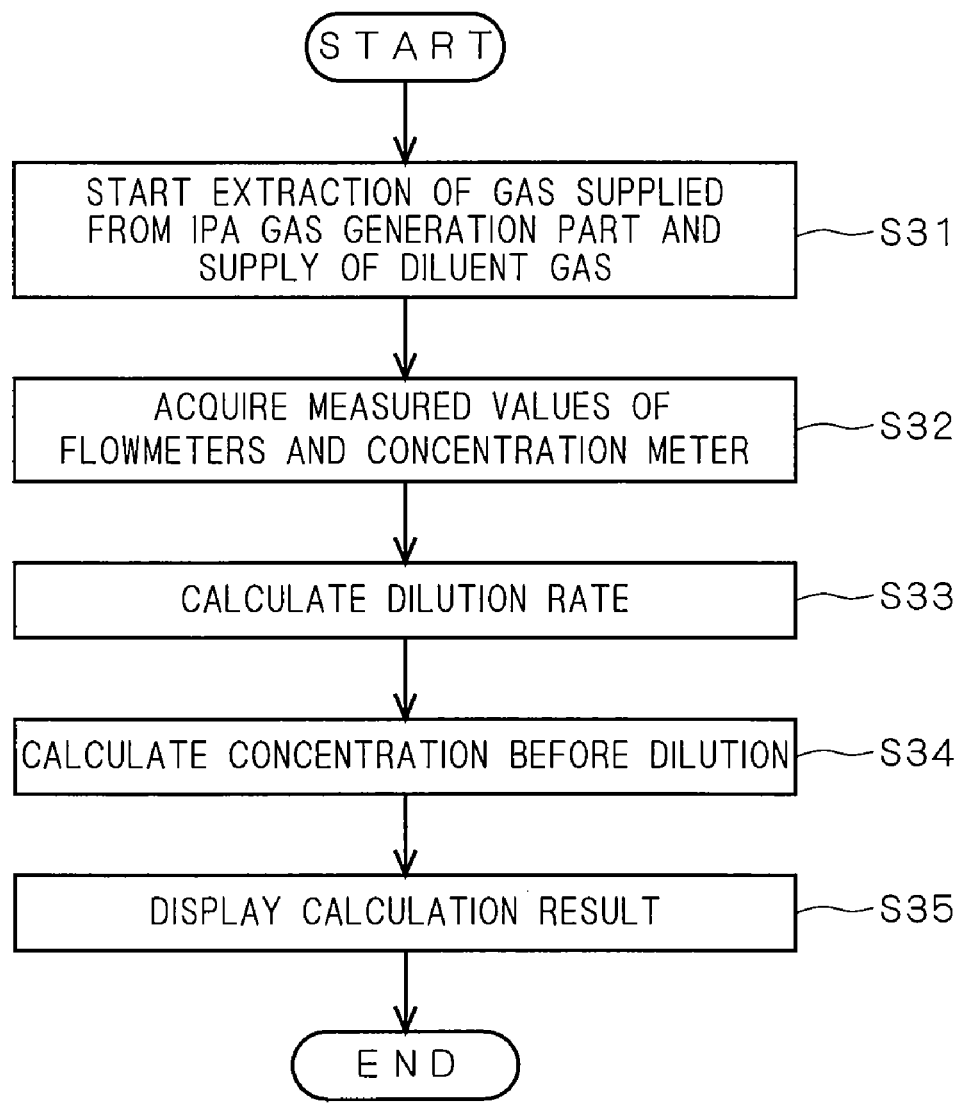
FIG. 6 is a flowchart showing an operation flow for measurement of concentration where gas supplied from an IPA gas generation part is used as a sample gas.

Next, referring to the flowchart of FIG. 6, discussion will be made on a process of measuring the concentration of IPA gas with the gas supplied from the IPA gas generation part 40 to the processing chamber 10 used as a sample gas. First, the substrate processing apparatus 1 opens the on-off valves 37, 55 and 57. This starts extraction of the gas supplied from the IPA gas generation part 40 and supply of a diluent gas (Step S31). Part of the gas supplied from the IPA gas generation part 40 to the processing chamber 10 is introduced to the pipe 53 as a sample gas and sent to the confluence 67 through the pipes 53 and 63. The nitrogen gas serving as a diluent gas is sent from the nitrogen gas source 20 to the confluence 67 through the pipes 31, 33 and 62. The sample gas and the nitrogen gas are mixed at the confluence 67, and the sample gas is thereby diluted. Then, the diluted sample gas is discharged to the exhaust line through the pipe 64.

At this time, the substrate processing apparatus 1 operates the heater 58 to heat the sample gas in the pipe 53. This prevents a decrease in temperature of the sample gas and suppresses condensation of the IPA gas contained in the sample gas. Further, the substrate processing apparatus 1 operates the heater 38 to heat the nitrogen gas in the pipe 33. This prevents a decrease in temperature of the sample gas during dilution and suppresses condensation of the IPA gas contained in the sample gas. Part of the nitrogen gas heated by the heater 38 is jetted from the jet part 68 into the container 61. This prevents a decrease in temperature of the sample gas in the entire pipe line included in the container 61 and suppresses condensation of the IPA gas contained in the sample gas.

Next, the substrate processing apparatus 1 acquires the respective measured values of the flowmeters 66, 70 and 72 and the concentration meter 73 (Step S32). The amount of flow of the diluent gas flowing in the pipe 62 is measured by the flowmeter 66 and the measured value is sent to the control part 80. The substrate processing apparatus 1 adjusts the degree of opening of the variable flow rate control valve 65 to control the flow rate of the diluent gas, and thereby stabilizes the measurement result of the flowmeter 66. This increases the accuracy of the following calculation. The amount of flow of the sample gas before being diluted is measured by the flowmeter 70 and the measured value is sent to the control part 80. The substrate processing apparatus 1 adjusts the degree of opening of the variable flow rate control valve 69 to control the flow rate of the sample gas, and thereby stabilizes the measurement result of the flowmeter 70. This increases the accuracy of the following calculation. The amount of flow of the sample gas after being diluted is measured by the flowmeter 72 and the measured value is sent to the control part 80.

The substrate processing apparatus 1 adjusts the degree of opening of the variable flow rate control valve 71 to control the flow rate of the sample gas, and thereby stabilizes the measurement result of the flowmeter 72. This increases the accuracy of the following calculation. The concentration of the IPA gas contained in the diluted sample gas is measured by the concentration meter 73 and the measured value is sent to the control part 80.

Subsequently, the substrate processing apparatus 1 calculates the dilution rate of the sample gas on the basis of the acquired measurement results (Step S33). The dilution rate can be calculated by using either of two calculations shown in FIGS. 4 and 5 and either one may be used therefor. With the calculation of FIG. 4, the dilution rate (P) of the sample gas is calculated by using the measured value (R1) of the flowmeter 70 and the measured value (R2) of the flowmeter 66, as $P=R1/(R1+R2)$. With the calculation of FIG. 5, the dilution rate (P) of the sample gas is calculated by using the measured value (R2) of the flowmeter 66 and the measured value (R3) of the flowmeter 72, as $P=(R3-R2)/R3$.

After that, the control part 80 multiplies the measured value (C1) of the concentration meter 73 by the reciprocal of the above dilution rate (1/P) to calculate the concentration (C0) of the IPA gas contained in the sample gas before being diluted, as $C0=C1\times(1/P)$ (Step S34). Then, the substrate processing apparatus 1 displays the calculated concentration (C0) of the IPA gas on the display part 81 (Step S35).

As discussed above, the substrate processing apparatus 1 dilutes a sample gas by mixing the sample gas with a diluent gas and measures the concentration of IPA gas contained in the diluted sample gas. Then, the substrate processing apparatus 1 calculates the concentration of the IPA gas contained in the sample gas before being diluted, on the basis of the calculated concentration value and the amount of flow of the sample gas and that of the diluent gas. Therefore, even if IPA gas of high concentration is used, it is possible to accurately measure the concentration of the IPA gas.

As a particular feature, the substrate processing apparatus 1 calculates the concentration of a process gas contained in the sample gas before being diluted, by multiplying the measured value of the concentration meter 73 by the reciprocal of a dilution rate which is obtained on the basis of the respective measured values of the flowmeters 66, 70 and 72. Therefore, it is possible to easily and accurately calculate the concentration of the process gas contained in the sample gas before being diluted.

Further, the substrate processing apparatus 1 comprises the variable flow rate control valve 65 for controlling the flow rate of the nitrogen gas flowing in the pipe 62, the variable flow rate control valve 69 for controlling the flow rate of the sample gas flowing in the pipe 63 and the variable flow rate control valve 71 for controlling the flow rate of the sample gas flowing in the pipe 64. This stabilizes the respective measured values of the flowmeters 66, 70 and 72, and it is therefore possible to more accurately calculate the concentration of IPA gas.

The substrate processing apparatus 1 further comprises the heater 38 for controlling the temperature of the nitrogen gas flowing in the pipe 33 and the heater 58 for controlling the temperature of the sample gas flowing in the pipe 53. This prevents a decrease in temperature of the sample gas and this suppresses condensation of the IPA gas contained in the sample gas. Therefore, it is possible to more accurately calculate the concentration of the IPA gas.

The substrate processing apparatus 1 further comprises the container 61 for accommodating the gas pipe line including the flowmeters 66, 70 and 72 and the concentration meter 73 and the jet part 68 for jetting the temperature-controlled nitrogen gas into the container 61. This prevents a decrease in temperature of the sample gas in the entire pipe line included in the container 61 and suppresses condensation of the IPA gas contained in the sample gas. Therefore, it is possible to more accurately calculate the concentration of the IPA gas.

Furthermore, the substrate processing apparatus 1 uses nitrogen gas which is a carrier gas, as a diluent gas. This allows dilution of the sample gas with accuracy without increasing the kinds of gas contained in the sample gas. Since the carrier gas and the diluent gas can be supplied from the same nitrogen gas source 20, it is possible to simplify the construction of the substrate processing apparatus 1.

Moreover, the substrate processing apparatus 1 is capable of switching between a state where gas inside the processing chamber 10 is used as a sample gas and another state where gas supplied from the IPA gas generation part 40 is used as a sample gas, by switching of ON and OFF (opening and closing) of the on-off valves 55 to 57. The substrate processing apparatus 1 can thereby respond to both the case of measuring the concentration of the IPA gas contained in the gas inside the processing chamber 10 and the case of measuring the concentration of the IPA gas contained in the gas supplied to the processing chamber 10.

<4. Variations>

Figure 7:
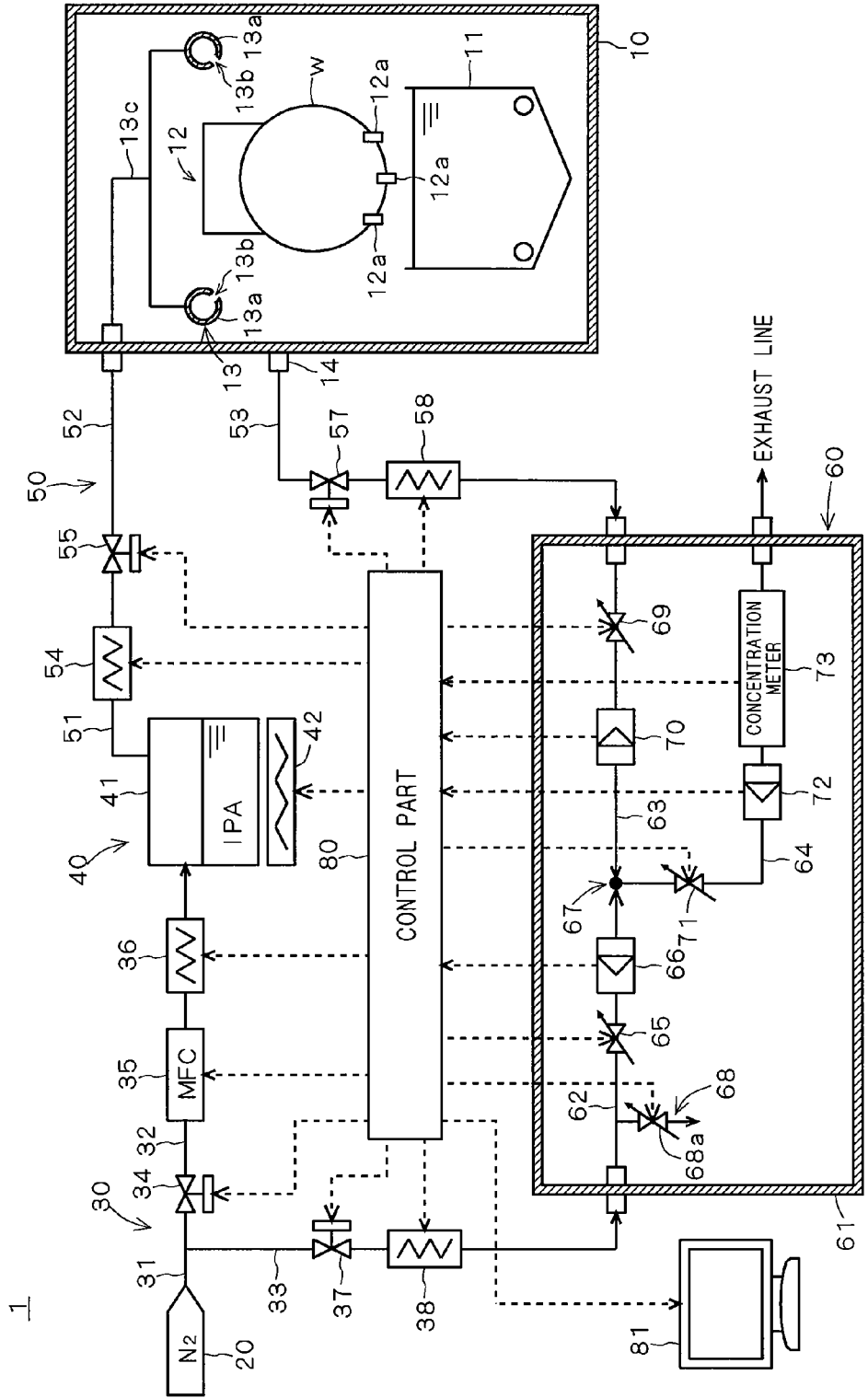
FIG. 7 is a block diagram showing a construction of a substrate processing apparatus in accordance with a variation.

Though one preferred embodiment of the present invention has been discussed above, the present invention is not limited to the above exemplary case. For example, the substrate processing apparatus 1 in the above case uses the IPA gas discharge part 13 for extracting part of the gas inside the processing chamber 10, but a gas extraction port may be additionally provided to extract the gas inside the processing chamber 10. Specifically, as shown in FIG. 7, a gas extraction port 14 is provided on the processing chamber 10, and the pipe 53 is connected to the gas extraction port 14. In such a construction, it is possible to extract the gas inside the processing chamber 10 while discharging the process gas from the IPA gas discharge part 13. In measurement of concentration by the substrate processing apparatus 1 of FIG. 7, the on-off valve 57 is opened as well as the on-off valve 37. With this operation, part of the gas inside the processing chamber 10 is taken into the gas extraction port 14 as a sample gas and the sample gas is sent to the confluence 67 through the pipes 53 and 63. The sample gas sent to the confluence 67 is mixed with the nitrogen gas supplied from the nitrogen gas source 20, to be thereby diluted. After that, the substrate processing apparatus 1 performs the process of measuring the concentration, after Step S22 of FIG. 3, like in the above-discussed section <2. Measurement of Concentration (Using Gas in Processing Chamber as Sample Gas>.

Further, the above-discussed substrate processing apparatus 1 has the flowmeter 70 for measuring the amount of flow of the sample gas before being diluted and the flowmeter 72 for measuring the amount of flow of the sample gas after being diluted, but the substrate processing apparatus 1 only has to have at least one of these flowmeters. Specifically, if the substrate processing apparatus 1 has only the flowmeter 70, the substrate processing apparatus 1 can calculate the concentration value C0 before dilution by adopting the calculation process of FIG. 4, and if the substrate processing apparatus 1 has only the flowmeter 72, the substrate processing apparatus 1 can calculate the concentration value C0 before dilution by adopting the calculation process of FIG. 5.

Furthermore, the substrate processing apparatus 1 serves to perform cleaning and drying of substrates in the processing chamber 10, but may perform only drying of substrates in the processing chamber 10. The substrate processing apparatus of the present invention may perform processing other than drying, by using a process gas other than IPA gas. Moreover, the above-discussed substrate processing apparatus 1 performs processing on a plurality of substrates W collectively, but the substrate processing apparatus may perform processing on substrates W one by one.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for processing a substrate with a process gas, comprising:
    a processing chamber for holding a substrate therein;
    a process gas supply part for supplying a process gas together with a carrier gas into said processing chamber;
    an extraction part for extracting part of gas inside said processing chamber as a sample gas;
    a diluent gas supply part for supplying a diluent gas to dilute a sample gas;
    a dilution part for diluting a sample gas by mixing the sample gas extracted by said extraction part with a diluent gas supplied by said diluent gas supply part;
    a concentration meter for measuring the concentration of a process gas contained in the sample gas diluted by said dilution part;
    a first flowmeter for measuring the amount of flow of the sample gas before being diluted, which flows in a pipe from said extraction part to said dilution part or the amount of flow of the sample gas after being diluted, which flows in a pipe from said dilution part;
    a second flowmeter for measuring the amount of flow of the diluent gas flowing in a pipe from said diluent gas supply part to said dilution part; and
    a calculation part for calculating the concentration of the process gas contained in the sample gas before being diluted, on the basis of respective measured values of said concentration meter, said first flowmeter and said second flowmeter.

2. The substrate processing apparatus according to claim 1, wherein
    said calculation part calculates the concentration of the process gas contained in the sample gas before being diluted, by multiplying the measured value of said concentration meter by the reciprocal of a dilution rate which is obtained on the basis of the respective measured values of said first flowmeter and said second flowmeter.

3. The substrate processing apparatus according to claim 2, further comprising
    a flow rate control part for sample gas before dilution, which controls the flow rate of the sample gas flowing in a pipe from said extraction part to said dilution part.

4. The substrate processing apparatus according to claim 3, further comprising
    a flow rate control part for sample gas after dilution, which controls the flow rate of the sample gas flowing in a pipe from said dilution part to said concentration meter.

5. The substrate processing apparatus according to claim 4, further comprising
    a flow rate control part for diluent gas, which controls the flow rate of the diluent gas flowing in a pipe from said diluent gas supply part to said dilution part.

6. The substrate processing apparatus according to claim 5, further comprising
    a temperature control part for sample gas, which controls the temperature of the sample gas flowing in a pipe from said extraction part to said dilution part.

7. The substrate processing apparatus according to claim 6, further comprising
    a temperature control part for diluent gas, which controls the temperature of the diluent gas flowing in a pipe from said diluent gas supply part to said dilution part.

8. The substrate processing apparatus according to claim 7, further comprising
    a container for accommodating a gas pipe line including said concentration meter, said first flowmeter and said second flowmeter; and
    a jet part for jetting the diluent gas of which temperature is controlled by said temperature control part for diluent gas into said container.

9. The substrate processing apparatus according to claim 8, wherein
    said diluent gas supply part supplies a carrier gas as a diluent gas.

10. The substrate processing apparatus according to claim 9, wherein
    said extraction part is capable of switching between a first state where part of gas inside said processing chamber is extracted as a sample gas and a second state where part of gas supplied by said process gas supply part is extracted as a sample gas.

11. The substrate processing apparatus according to claim 9, wherein
    said extraction part extracts a sample gas through a gas extraction port which is provided separately from said process gas supply part.

12. A substrate processing apparatus for processing a substrate with a process gas, comprising:
    a processing chamber for holding a substrate therein;
    a process gas supply part for supplying a process gas together with a carrier gas into said processing chamber;
    an extraction part for extracting part of gas supplied from said process gas supply part into said processing chamber as a sample gas;
    a diluent gas supply part for supplying a diluent gas to dilute a sample gas;
    a dilution part for diluting a sample gas by mixing the sample gas extracted by said extraction part with a diluent gas supplied by said diluent gas supply part;
    a concentration meter for measuring the concentration of a process gas contained in the sample gas diluted by said dilution part;
    a first flowmeter for measuring the amount of flow of the sample gas before being diluted, which flows in a pipe from said extraction part to said dilution part or the amount of flow of the sample gas after being diluted, which flows in a pipe from said dilution part;
    a second flowmeter for measuring the amount of flow of the diluent gas flowing in a pipe from said diluent gas supply part to said dilution part; and
    a calculation part for calculating the concentration of the process gas contained in the sample gas before being diluted, on the basis of respective measured values of said concentration meter, said first flowmeter and said second flowmeter.

13. The substrate processing apparatus according to claim 12, wherein
    said calculation part calculates the concentration of the process gas contained in the sample gas before being diluted, by multiplying the measured value of said concentration meter by the reciprocal of a dilution rate which is obtained on the basis of the respective measured values of said first flowmeter and said second flowmeter.

14. The substrate processing apparatus according to claim 13, further comprising a flow rate control part for sample gas before dilution, which controls the flow rate of the sample gas flowing in a pipe from said extraction part to said dilution part.

15. The substrate processing apparatus according to claim 14, further comprising a flow rate control part for sample gas after dilution, which controls the flow rate of the sample gas flowing in a pipe from said dilution part to said concentration meter.

16. The substrate processing apparatus according to claim 15, further comprising a flow rate control part for diluent gas, which controls the flow rate of the diluent gas flowing in a pipe from said diluent gas supply part to said dilution part.

17. The substrate processing apparatus according to claim 16, further comprising a temperature control part for sample gas, which controls the temperature of the sample gas flowing in a pipe from said extraction part to said dilution part.

18. The substrate processing apparatus according to claim 17, further comprising a temperature control part for diluent gas, which controls the temperature of the diluent gas flowing in a pipe from said diluent gas supply part to said dilution part.

19. The substrate processing apparatus according to claim 18, further comprising a container for accommodating a gas pipe line including said concentration meter, said first flowmeter and said second flowmeter; and a jet part for jetting the diluent gas of which temperature is controlled by said temperature control part for diluent gas into said container.

20. The substrate processing apparatus according to claim 19, wherein said diluent gas supply part supplies a carrier gas as a diluent gas.

\* \* \* \* \*